(12) United States Patent
Wang et al.

(10) Patent No.: US 10,818,875 B2
(45) Date of Patent: Oct. 27, 2020

(54) ORGANIC LIGHT-EMITTING DISPLAY PANEL AND ORGANIC LIGHT-EMITTING DISPLAY DEVICE

(71) Applicant: Shanghai Tianma AM-OLED Co., Ltd., Shanghai (CN)

(72) Inventors: Xiangcheng Wang, Shanghai (CN); Jinghua Niu, Shanghai (CN); Ding Li, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 6 days.

(21) Appl. No.: 15/912,909

(22) Filed: Mar. 6, 2018

(65) Prior Publication Data

US 2019/0088905 A1 Mar. 21, 2019

(30) Foreign Application Priority Data

Sep. 21, 2017 (CN) .......................... 2017 1 0859892

(51) Int. Cl.
*H01L 51/52* (2006.01)
*H01L 27/32* (2006.01)
*H01L 51/50* (2006.01)

(52) U.S. Cl.
CPC ........ *H01L 51/5265* (2013.01); *H01L 27/326* (2013.01); *H01L 27/3211* (2013.01);
(Continued)

(58) Field of Classification Search
CPC ................................................. H01L 27/3216
See application file for complete search history.

(56) References Cited

U.S. PATENT DOCUMENTS

2011/0127500 A1* 6/2011 Ko ...................... H01L 27/3211
257/40
2014/0361257 A1* 12/2014 Park .................... H01L 51/5064
257/40
(Continued)

FOREIGN PATENT DOCUMENTS

| CN | 102082164 A | 6/2011 |
| CN | 103227186 A | 7/2013 |

(Continued)

OTHER PUBLICATIONS

Chinese Office Action dated Sep. 4, 2019 for corresponding CN Application No. 201710859892.4 and English translation.

*Primary Examiner* — Raj R Gupta
(74) *Attorney, Agent, or Firm* — Tarolli, Sundheim Covell & Tummino LLP

(57) ABSTRACT

The present disclosure provides an organic light-emitting display panel and an organic light-emitting display device for improving the uniformity of the display effects of both sides. The organic light-emitting display panel includes an array substrate having a plurality of pixel units; a plurality of organic light-emitting diodes located in the pixel units of the array substrate. The plurality of organic light-emitting diodes includes a plurality of first organic light-emitting diodes and a plurality of second organic light-emitting diodes, wherein the first organic light-emitting diodes are organic bottom light-emitting diodes and the second organic light-emitting diodes are organic top light-emitting diodes. The area of the pixel unit where the first organic light-emitting diodes are located is larger than area of the pixel unit where the second organic light-emitting diodes are located. The organic light-emitting display panel according to the present disclosure is applied in a display device.

17 Claims, 8 Drawing Sheets

(52) U.S. Cl.
CPC ...... *H01L 27/3216* (2013.01); *H01L 51/5064* (2013.01); *H01L 51/5088* (2013.01); *H01L 51/5218* (2013.01); *H01L 51/5231* (2013.01); *H01L 51/5234* (2013.01); *H01L 51/5275* (2013.01); *H01L 27/3244* (2013.01); *H01L 2251/308* (2013.01); *H01L 2251/5323* (2013.01); *H01L 2251/558* (2013.01)

(56) References Cited

U.S. PATENT DOCUMENTS

| | | | | |
|---|---|---|---|---|
| 2015/0188067 | A1* | 7/2015 | Lee | H01L 51/5012 |
| | | | | 257/40 |
| 2017/0040405 | A1* | 2/2017 | Zhang | H01L 51/50 |

FOREIGN PATENT DOCUMENTS

| | | |
|---|---|---|
| CN | 104241317 A | 12/2014 |
| CN | 104701351 A | 6/2015 |
| CN | 104752614 A | 7/2015 |
| CN | 105789239 A | 7/2016 |

\* cited by examiner

ORGANIC LIGHT-EMITTING DISPLAY PANEL AND ORGANIC LIGHT-EMITTING DISPLAY DEVICE

CROSS-REFERENCE TO RELATED APPLICATIONS

The present application claims priority to Chinese Patent Application No. 201710859892.4, filed on Sep. 21, 2017, the content of which is incorporated herein by reference in its entirety.

TECHNICAL FIELD

The present disclosure relates to the field of display technologies and, in particular, relates to an organic light-emitting display panel and an organic light-emitting display device.

BACKGROUND

Organic light-emitting diode (OLED) is widely used in display devices due to its characteristics of self-luminous, wide viewing angle and short response time.

In the related art, an organic light-emitting display device has two light-emitting modes: top light-emitting mode and bottom light-emitting mode. However, a general organic light-emitting display device only adopts one of the two light-emitting modes, and two sides of the organic light-emitting display device in the related art do not emit light at the same time.

Further, even if the both sides of the organic light emitting display device are used for emitting light, the different structures of the substrates on the two sides still results in inconsistent light-emitting performance, i.e. luminance of emitting light on one side is higher than that on the other side, thereby leading to a relatively obvious difference between display effects of the two sides.

SUMMARY

The present disclosure provides an organic light-emitting display panel and an organic light-emitting display device having the organic light-emitting display panel, for improving uniformity of the display effects of both sides.

In a first aspect, the present disclosure provides an organic light-emitting display panel, including: an array substrate, the array substrate having a plurality of pixel units; and a plurality of organic light-emitting diodes, located in the pixel units of the array substrate, the plurality of organic light-emitting diodes include a plurality of first organic light-emitting diodes and a plurality of second organic light-emitting diodes, wherein the first organic light-emitting diodes are organic bottom light-emitting diodes and the second organic light-emitting diodes are organic top light-emitting diodes; and wherein an area of the pixel unit where the first organic light-emitting diodes are located is larger than an area of the pixel unit where the second organic light-emitting diodes are located.

In a second aspect, the present disclosure provides an organic light-emitting display device, including an organic light-emitting display panel, and the organic light-emitting display panel includes: an array substrate, the array substrate having a plurality of pixel units; and a plurality of organic light-emitting diodes, located in the pixel units of the array substrate, the plurality of organic light-emitting diodes include a plurality of first organic light-emitting diodes and a plurality of second organic light-emitting diodes, wherein the first organic light-emitting diodes are organic bottom light-emitting diodes and the second organic light-emitting diodes are organic top light-emitting diodes; and wherein an area of the pixel unit where the first organic light-emitting diodes are located is larger than an area of the pixel unit where the second organic light-emitting diodes are located.

Any one of the technical solutions described above has following beneficial effects:

In the embodiments of the present disclosure, in a direction perpendicular to the array substrate, since the light emitting direction of the first organic light-emitting diode is opposite to the light emitting direction of the second organic light-emitting diode in a direction perpendicular to the array substrate, it can be concluded that the organic light-emitting display panel provided in the embodiments of the present disclosure is a bilateral organic light-emitting display panel, i.e., adopting both the top light-emitting mode and the bottom light-emitting mode. In the bilateral organic light-emitting display panel, with respect to the bottom light-emitting mode, the top light-emitting mode does not pass through the substrate, on which the circuit is arranged. Therefore, the top light-emitting mode has a higher aperture ratio, so that the luminance (luminous intensity per unit area) in the top light-emitting models higher than the luminance of the bottom light-emitting mode. In the embodiments, the first organic light-emitting diodes are organic bottom light-emitting diodes, while the second organic light-emitting diodes are organic top light-emitting diodes. Since the area of the pixel unit where the first organic light-emitting diodes (the organic bottom light-emitting diodes) are located is larger than the area of the pixel unit in which the second organic light-emitting diodes (the organic top light-emitting diodes) are located, the total amount of emitting light on the emitting sides of the first organic light-emitting diodes equals to or basically equals to the total amount of emitting light on the emitting sides of the second organic light-emitting diodes, and thus uniformity of display effects on two sides are achieved.

BRIEF DESCRIPTION OF DRAWINGS

In order to clarify the technical solutions in the embodiments of the present invention or in the related art, the accompanying drawings for describing the embodiments or the related art are briefly introduced as follows. It is appreciated that, the drawings in the following description illustrate some embodiments of the present invention, and those skilled in the art can derive other drawings from these without creative efforts.

DESCRIPTION OF EMBODIMENTS

In order to clarify the objectives, technical solutions and advantages of the embodiments of the present disclosure, the technical solutions of the embodiments of the present disclosure will be described clearly and comprehensively with reference to the accompanying drawings. Obviously, only a part of the embodiments of the present disclosure is described herein, rather than all of the embodiments. On the basis of the embodiments in the present disclosure, all other embodiments obtained by those skilled in the art without any creative efforts hall fall within the protection scope of the present disclosure.

The technical terms used in the embodiments of the present disclosure are merely used for the purpose of describing particular embodiments, and are not intended to limit the present disclosure. The singular forms "a", "an" and "the" used in the embodiments of the present disclosure and the appended claims also include the meaning of the plural forms, unless the context clearly dictates otherwise.

It should be understood that, the term "and/or", as used herein, is merely an expression of relationship between associated objects, meaning that there may exist three relationships, i.e. A and/or B may mean three situations: only A, A and B, only B. In addition, the character "/" in the context generally means that the associated objects are in "or" relationship.

It should be understood that, even the organic light-emitting diode are termed as the first or second organic light-emitting diode, they are not limited to these terms. These terms are only used to distinguish the organic light-emitting diodes from one another. For example, the first organic light-emitting diode can also be named as the second organic light-emitting diode without departing from the scope of the embodiments of the present disclosure. Similarly, the second organic light emitting diode can also be named as the first organic light-emitting diode. A first emitting light color can also be called as a second emitting light color, or even as the third emitting light color.

Figure 1:
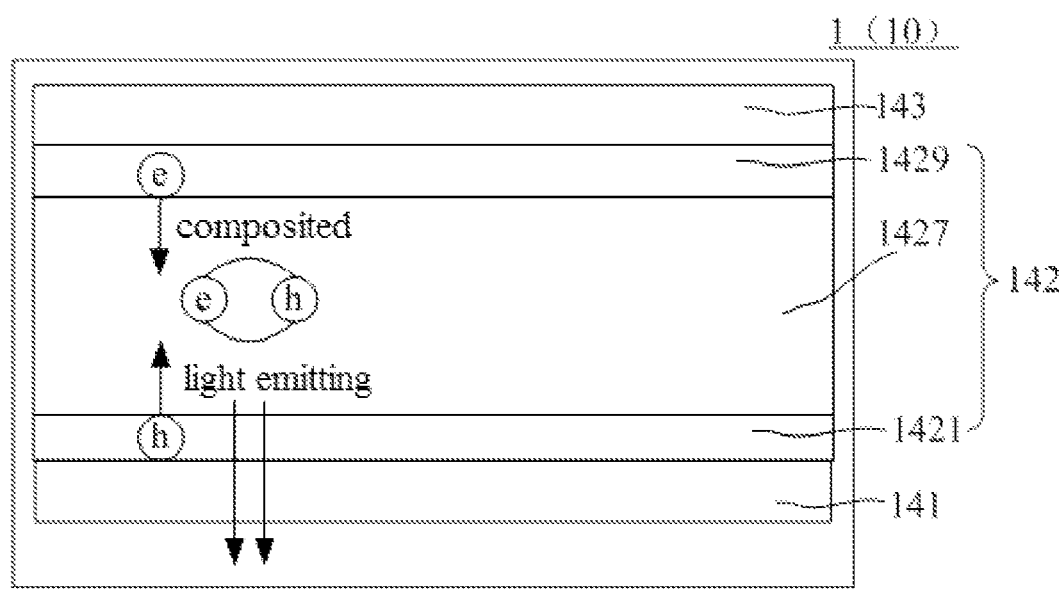
FIG. 1 illustrates a light-emitting principle diagram of an organic light-emitting diode provided in an embodiment of the present disclosure.

Before the technical solutions of the present disclosure are introduced in detail, the light-emitting principle of the organic light-emitting diode is simply introduced. FIG. 1 illustrates a light-emitting principle diagram of an organic light-emitting diode provided in an embodiment of the present disclosure. The organic light-emitting display panel 1 includes an array substrate 10. The array substrate 10 includes an anode 141, a cathode 143 arranged opposite to the anode 141, and an organic functional layer 142 arranged between the anode 141 and the cathode 143. The organic functional layer 142 includes an electron transmission layer 1429, a hole transmission layer 1421 and a light-emitting layer 1427. The electron transmission layer 1429 is arranged near the cathode 143, the hole transmission layer 1421 is arranged near the anode 141, and the light-emitting layer 1427 is arranged between the electron transmission layer 1429 and the hole transmission layer 1421.

Under the application of an external electric field, electrons e are injected into the organic functional layer 142, and holes h are injected from the anode 141 into the organic functional layer 142. The injected electrons e migrate from the electron transmission layer 1429 of the organic functional layer 142 to the light-emitting layer 1427 of the organic functional layer 142, while the injected holes h migrate from the hole transmission layer 1421 of the organic functional layer 142 to the light-emitting layer 1427 of the organic functional layer 142. Excitons are generated after the injected electrons e and the injected holes h are composited in the light-emitting layer 1427. The excitons migrate under the effect of the electric field and transfer energy to the organic light-emitting molecules in the light-emitting layer 1427. The electrons of the organic light-emitting molecules transit from the ground state to the excited state and release energy, and finally the energy is released in the form of photons, thereby forming light.

The microcavity light-emitting mode involved in the present disclosure following this embodiment is briefly described as follows:

The anode and the cathode together form a microcavity (resonant cavity); when the length of the microcavity and the wavelength of the light wave satisfy a certain relationship, the light with a specific wavelength (the wavelength of a certain monochromatic light) will be intensified and the spectrum will be narrowed, which is called as Microcavity Effect. The microcavity effect meets the following relationship:

$$m\lambda = 2nL + \Phi/2\pi,$$

In the above equation, m is a resonance modulus, which is normally a integer; $\lambda$ is the wavelength of a monochromatic light, which can be red, green, blue light or the like; n is an index of refraction of each film layer in the microcavity; L is the thickness of the organic functional layer between the anode and the cathode; $\Phi$ is the phase shift of the light directly emitting through the surface of the cathode and the light emitting through the surface of the cathode after being reflected by the anode. It can be understood that, the thickness of the organic functional layer has a certain relationship with the wavelength of the monochromatic light, and the purposes of narrowing the spectrum and enhancing the light-emitting efficiency of the monochromatic light can be achieved by adjusting the thickness of the organic functional layer. Meanwhile, the microcavity is specialized for a monochromatic light. When the organic light-emitting display panel includes organic light-emitting diodes with a plurality of colors, different colors correspond to different thicknesses of the organic functional layers, for enhancing light-emitting efficiency of various color lights.

Figure 2:
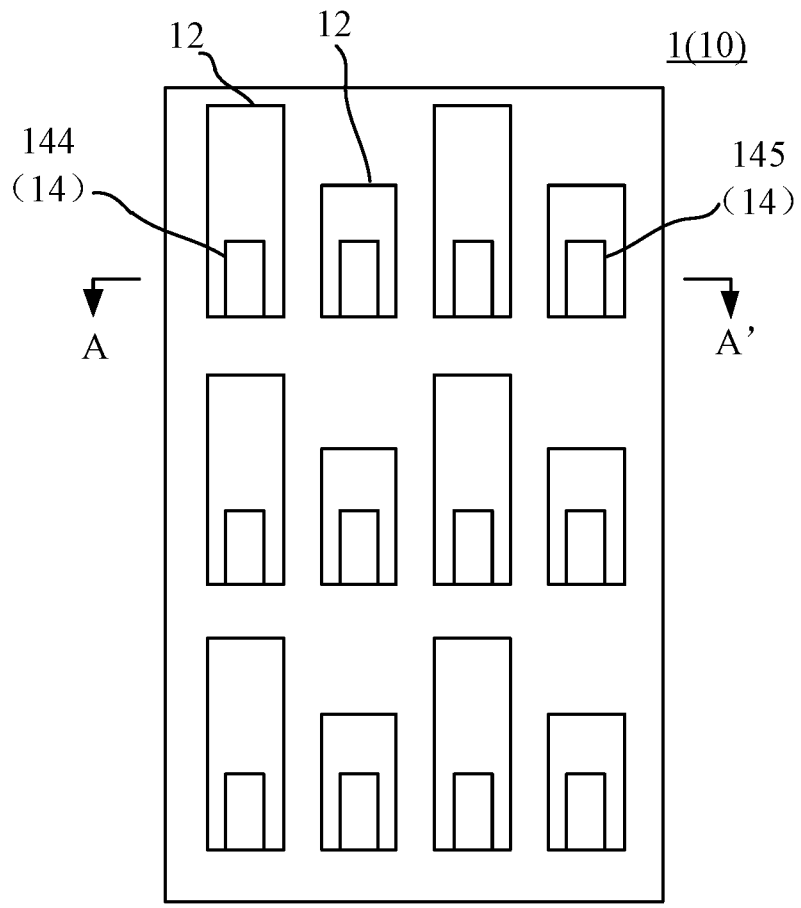
FIG. 2 illustrates a first structural schematic diagram of an organic light-emitting display panel provided in an embodiment of the present disclosure.
Figure 3:
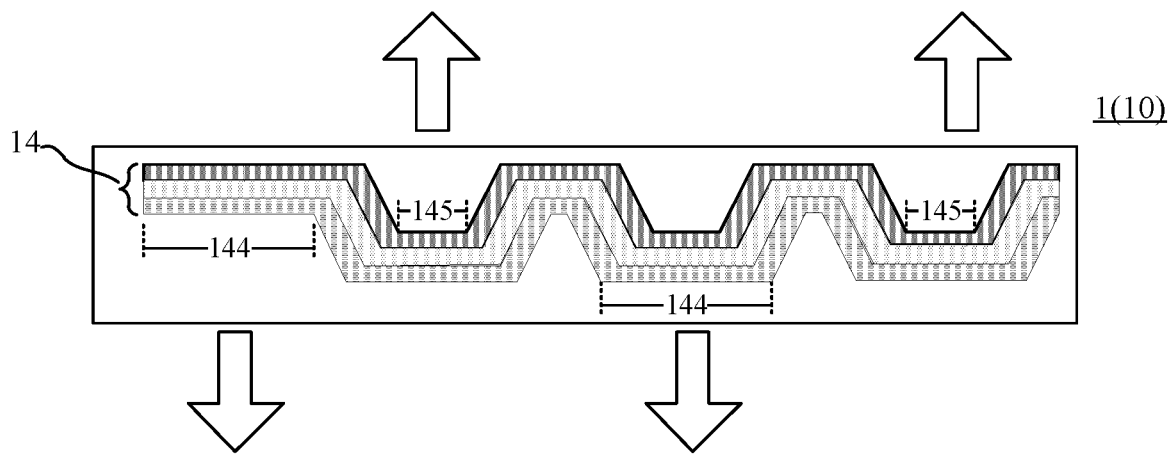
FIG. 3 illustrates a cross-sectional view along AA' in FIG. 2.

The embodiments of present disclosure provide an organic light-emitting display panel, as shown in FIG. 2 and FIG. 3. FIG. 2 illustrates a first structural schematic diagram of an organic light-emitting display panel provided in an embodiment of the present disclosure, and FIG. 3 illustrates a cross-sectional view along AA' in FIG.2. The organic light-emitting display panel 1 includes: an array substrate 10 having a plurality of pixel units 12; a plurality of organic light-emitting diodes 14 located in the pixel units 12 of the array substrate 10. The plurality of organic light-emitting diodes 14 includes a plurality of first organic light-emitting diodes 144 and a plurality of second organic light-emitting diodes 145. The luminance of the first organic light-emitting diodes 144 is lower than that of the second organic light-emitting diodes 145. The area of the pixel units 12 in which the first organic light-emitting diodes 144 are located is larger than the area of the pixel units 12 in which the second organic light-emitting diodes 145 are located. The light emitting direction of the first organic light-emitting diode 144 is opposite to that of the second organic light-emitting diode 145 in a direction perpendicular to the array substrate 10.

The organic light-emitting display panels in the related art generally adopt a unilateral light-emitting mode, such as a top light-emitting mode or a bottom light-emitting mode, since bilateral light-emitting mode may lead to inconsistent performances on two sides, i.e. the luminance of emitting light of the organic light-emitting diodes on one side is higher than that on the other side. In order to improve the uniformity of the luminance of emitting light of the organic light-emitting diodes on both sides, the organic light-emitting diodes on both sides should be provided with different currents, which mean a necessary redesign of the pixel circuit and a longer production cycle, thereby increasing the difficulties of manufacturing and the cost accordingly.

In this embodiment, while the light emitting direction of the first organic light-emitting diode is opposite to that of the second organic light-emitting diode in the direction perpendicular to the array substrate, it can be concluded that the organic light-emitting display panel provided in this embodiment is an organic bilateral light emitting display panel, which can achieve both the top light-emitting mode and the bottom light-emitting mode at the same time. In the organic bilateral light emitting display panel, with respect to the bottom light-emitting mode, the top light-emitting mode does not pass through the substrate, on which the circuit is arranged. Therefore, the top light-emitting mode has a higher aperture ratio, so that the luminance (luminous intensity per unit area) the top light-emitting mode is higher than the luminance of the bottom light-emitting mode. In this embodiment, the first organic light-emitting diodes are organic bottom light-emitting diodes, while the second organic light-emitting diodes are organic top light-emitting diodes. Since the area of the pixel unit in which the first organic light-emitting diodes (the organic bottom light-emitting diodes) are located is larger than the area of the pixel unit in which the second organic light-emitting diodes (the organic top light-emitting diodes) are located, the total amount of emitting light on the emitting sides of the first organic light-emitting diodes equals to or basically equals to the total amount of emitting light on the emitting sides of the second organic light-emitting diodes, and thus improve uniformity of display effects on both sides are achieved.

In this embodiment, it is unnecessary to provide different currents to the first organic light-emitting diodes and the second organic light-emitting diodes, so that the pixel circuit does not need to be redesigned. Therefore, compared with the related art, the organic light-emitting display panel in this embodiment has advantages of relatively short production cycle, lower difficulty of production and lower cost.

It should be understood that, the area of the pixel units is the aperture ratio of the pixel units. The larger the area is, the greater the aperture ratio is, and the higher the luminance is. Luminous intensity should be understood as total amount of light emitted from a specific direction. Luminance should be understood as luminous intensity per unit area.

Further, referring to FIG. 2 and FIG. 3, in this embodiment, the area of the pixel unit in which the first organic light-emitting diodes 144 are located is 1.2-2.5 times of the area of the pixel unit in which the second organic light-emitting diodes 145 are located, preferably the area of the pixel unit in which the first organic light-emitting diodes 144 are located is 1.5-2.5 times of the area of the pixel unit in which the second organic light-emitting diodes 145 are located, more preferably, the area of the pixel unit in which the first organic light-emitting diodes 144 are located is 1.8-2.5 times of the area of the pixel unit in which the second organic light-emitting diodes 145 are located, so that the luminous intensity of the organic bottom light-emitting diodes is uniform and consistent with the organic top light-emitting diodes in the organic light-emitting display panel according to the present embodiment, thereby achieving better display effect.

In an embodiment, the luminous intensity of the pixel units in which the second organic light-emitting diodes are located is greater than that of the pixel units in which the first organic light-emitting diodes are located. It can be seen from the above embodiments that, with respect to the organic light emitting display panel prepared by using the microcavity effect, the organic top light-emitting diodes (i.e., the second organic light-emitting diodes) adopt a strong microcavity structure, while the organic bottom light-emitting diodes (i.e., the first organic light-emitting diodes) adopt a weak microcavity structure, and the luminous intensity in the strong microcavity structure is greater than that in the weak microcavity structure. Although the second organic light-emitting diodes have greater luminous intensity per unit area than the first organic light-emitting diode, it can be seen from the above embodiments that the area of the pixel unit where the first organic light emitting diodes are located is larger than the area of the pixel unit where the second organic light emitting diodes are located, so that the luminous intensities of the top and bottom light-emitting modes tend to be the same, effectively improving the display effect.

It should be explained that, as described above, the microcavity structure corresponding to a certain monochromatic light can be formed by adjusting the thickness of the organic functional layer and the position of the light-emitting layer arranged in the organic functional layer. In an embodiment, since the bottom light-emitting mode and the top light-emitting mode share a same microcavity structure, it is inevitable in the process of forming the microcavity structure that the light intensity and the luminous intensity per unit area are greater on one side and the luminous intensity per unit area on the other side is lower due to a farther location from the light-emitting layer, which may lead to non-uniform luminous intensity at two sides. In this embodiment, the microcavity structure and the light-emitting layer are arranged in the top light-emitting mode, therefore, luminance of the top light-emitting mode is certainly greater than that of the bottom light-emitting mode. The insufficient luminous intensity of the bottom light-emitting mode is compensated by increasing the area of the pixel unit where the organic bottom light-emitting diodes (the first organic light-emitting diodes) are located, so that the luminous intensities of the top and bottom light-emitting modes tend to be the same, thereby effectively improving the display effect.

Figure 4:
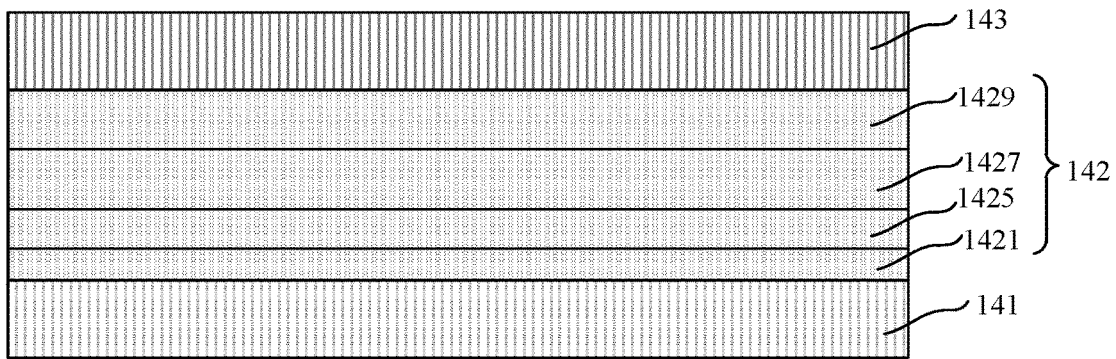
FIG. 4 illustrates a second structural schematic diagram of an organic light-emitting display panel provided in an embodiment of the present disclosure.

The following describes the structure of the organic light-emitting diode according to the present embodiment:

FIG. 4 illustrates a second structural schematic diagram of an organic light-emitting display panel provided in an embodiment of the present disclosure. The organic light-emitting diode 14 includes an anode 141, a cathode 143 arranged opposite to the anode 141 and an organic functional layer 142 arranged between the anode 141 and the cathode 143. The organic functional layer 142 includes a microcavity adjusting layer 1421, an electron transmission layer 1429, and a light-emitting layer 1427 arranged between the microcavity adjusting layer 1421 and the electron transmission layer 1429. The microcavity adjusting layer 1421 is in contact with the anode 141, and the electron transmission layer 1429 is in contact with the cathode 143. A hole transmission layer is provided at the anode side, for accelerating the hole transmission to the light-emitting layer, and an electron transmission layer is provided at the cathode side, for accelerating the electron transmission to the light-emitting layer, so that the electrons and holes composite to generate excitons in the light-emitting layer, thereby emitting light.

Figure 5:
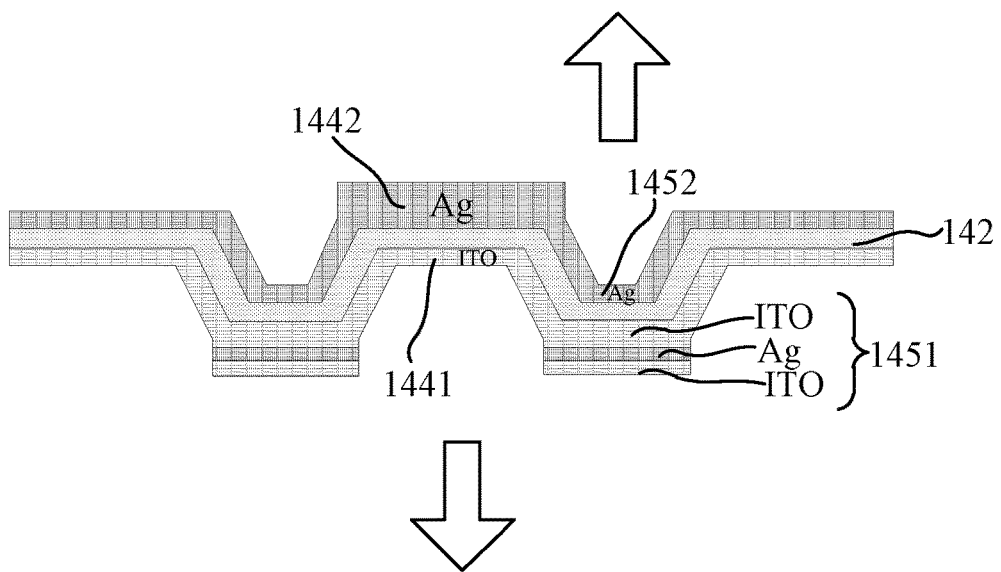
FIG. 5 illustrates a third structural schematic diagram of an organic light-emitting display panel provided in an embodiment of the present disclosure.

In addition, FIG. 5 illustrates a third structural schematic diagram of an organic light-emitting display panel provided in an embodiment of the present disclosure. A total reflection cathode 1442 is used as a cathode of an organic bottom light-emitting diode 144, and a transparent anode 1441 is used as an anode of the organic bottom light-emitting diode 144. In a microcavity structure formed between the transparent anode and the total reflection cathode, the anode on the light-emitting side of the microcavity structure has relatively poor reflectivity, which leads to a relative weak microcavity structure.

A total reflection anode 1451 can be used as an anode of an organic top light-emitting diode 145 and a translucent cathode 1452 is used as a cathode of the organic top light-emitting diode 145. The translucent cathode as an emitting side of top light-emitting has certain reflectivity, so that light can be intensified and narrowed in a microcavity structure formed between the total reflection anode and the translucent cathode, and thus the microcavity structure formed by the organic top light-emitting diode is relatively strong.

Further, referring to FIG. 5, the cathode material of the organic bottom light-emitting diode 144 can be silver, which has a thickness greater than 500 Å, while the anode material is ITO (indium tin oxide), which has a thickness greater than 80 Å. The cathode material of the organic top light-emitting diode 145 is silver or magnesium-silver alloy, which has a thickness lower than 200 Å, while the anode material is ITO/Ag/ITO (indium tin oxide/Ag/indium tin oxide, i.e., two ITO layers and an Ag layer therebetween), in which the Ag (silver) layer has a thickness greater than 500 Å, the ITO layer adjacent to the organic functional layer 142 has a thickness lower than 1000 Å. The cathode material of the organic bottom light-emitting diode is far thicker than the cathode material of the organic top light-emitting diode. The reason is in that, the cathode material of the organic bottom light-emitting diode is a total reflection cathode, the greater the thickness is, the lower the transmission performance is, and the higher the reflection performance is.

The emitting light with different colors can be obtained by adjusting different resonant wavelengths of an optical microcavity. Since the thickness of the organic functional layer in the organic light-emitting diode corresponds to the wavelength (resonant wavelength) of a specific monochromatic light, the light is intensified and the spectrum is narrowed by controlling the thickness of the organic functional layer. As a result, the color saturation of the light is better. The thickness of the microcavity adjusting layer in the present embodiment is ½ greater than the total thickness of the organic functional layer. In this embodiment, the total thickness of the organic functional layer is controlled by controlling the thickness of the microcavity adjusting layer, thereby obtaining a specific monochromatic wavelength.

Figure 6:
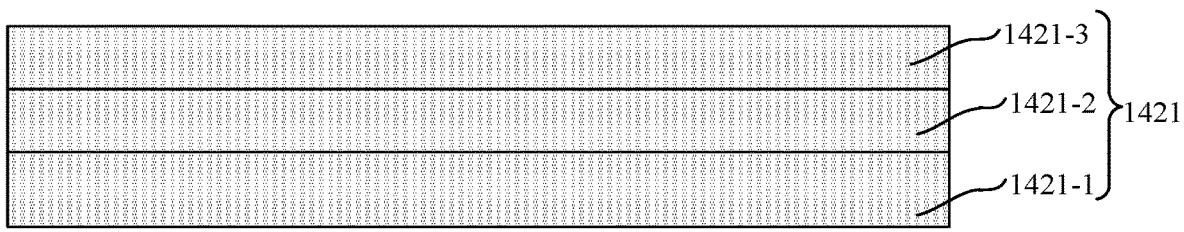
FIG. 6 illustrates a structural schematic diagram of a microcavity adjusting layer provided in an embodiment of the present disclosure.

Further, FIG. 6 illustrates a structural schematic diagram of a microcavity adjusting layer provided in an embodiment of the present disclosure. The microcavity adjusting layer 1421 can include a hole injection layer 1421-1, a first hole transmission layer 1421-2 and a second hole transmission layer 1421-3. It should be noted that the thicknesses and positions of the hole injection layer, the first hole transmission layer and the second hole transmission layer are not particularly limited in the embodiments.

Figure 7:
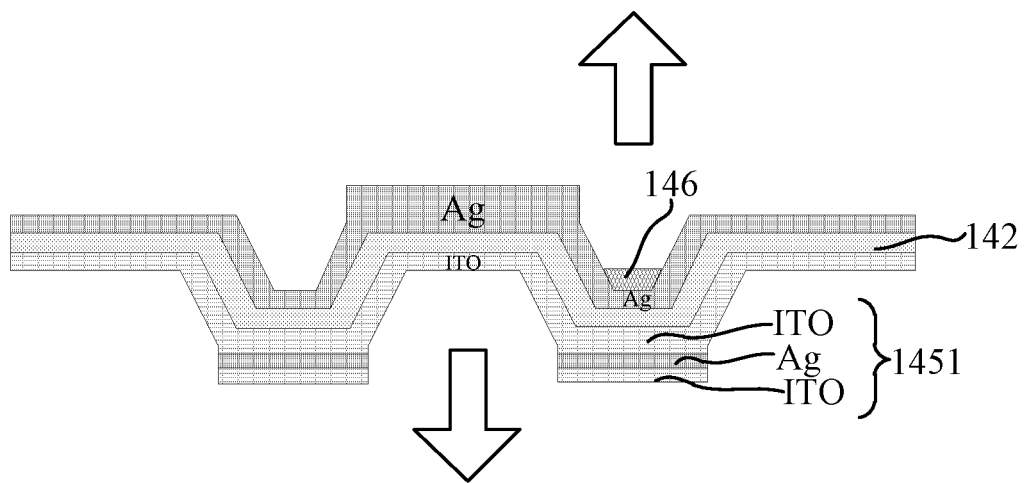
FIG. 7 illustrates a fourth structural schematic diagram of an organic light-emitting display panel provided in an embodiment of the present disclosure.

FIG. 7 illustrates a fourth structural schematic diagram of an organic light-emitting display panel provided in an embodiment of the present disclosure. In order to enhance the light-emitting efficiency of the top light-emitting side, a cap layer 146 is provided on a side of the cathode of the organic top light-emitting diode 145 away from the organic functional layer 142. On one hand, the cap layer protects the cathode in the organic top light-emitting diode from oxidation and thus protects the organic top light-emitting diode. On the other hand, less light emitted from the light-emitting layer is reflected and more light is emitted in a specific direction or in a direction near the specific direction, due to a relative high index of refraction of the cap layer.

Figure 8:
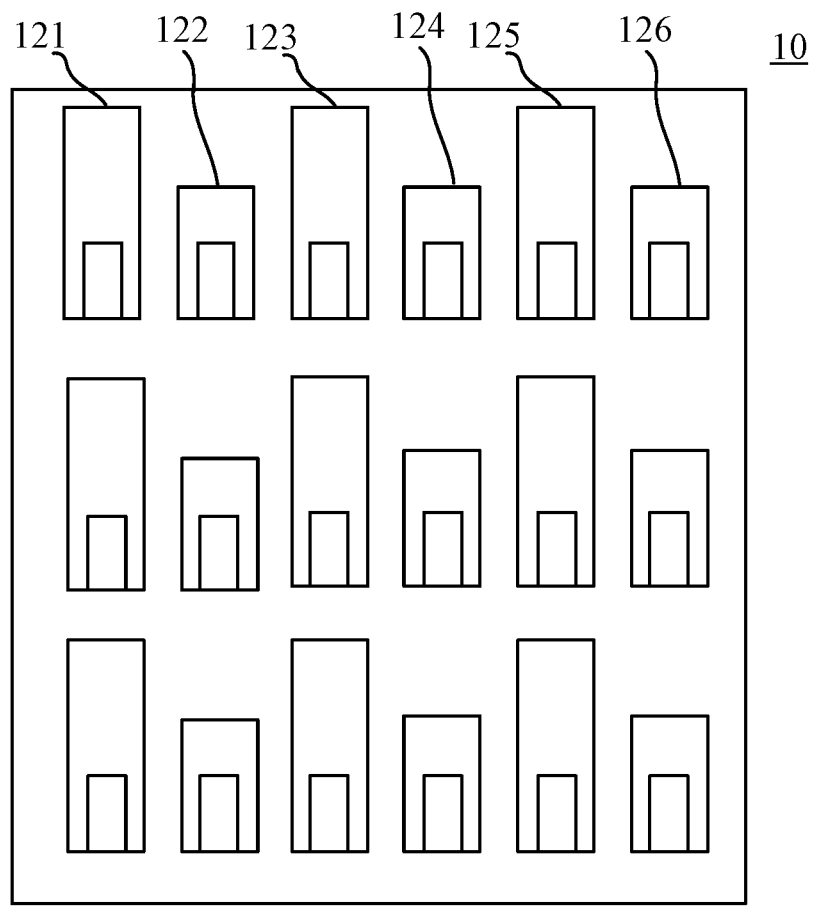
FIG. 8 illustrates a fifth structural schematic diagram of an organic light-emitting display panel provided in an embodiment of the present disclosure.

In an embodiment, as shown in FIG. 8, which is a fifth structural schematic diagram of an organic light-emitting display panel provided in an embodiment of the present disclosure, a plurality of pixel units 12 are arranged in an array on the array substrate 10. The first organic light-emitting diodes 144 includes a first organic light-emitting diode 121 having a first emitting light color, a first organic light-emitting diode 123 having a second emitting light color, and a first organic light-emitting diode 125 having a third emitting light color. The second organic light-emitting diodes 145 including a second organic light-emitting diode 122 having a first emitting light color, a second organic light-emitting diode 124 having a second emitting light color, and a second organic light-emitting diode 126 having a third emitting light color. The first emitting light color, the second emitting light color and the third emitting light color are different from one another and selected from a group consisting of red, green and blue.

It should be noted that, FIG. 8 only exemplarily illustrates the plurality of the first organic light-emitting diodes and the plurality of the second organic light-emitting diodes, while the number of the first and second organic light-emitting diodes is not specifically limited in the present embodiment.

Figure 9:
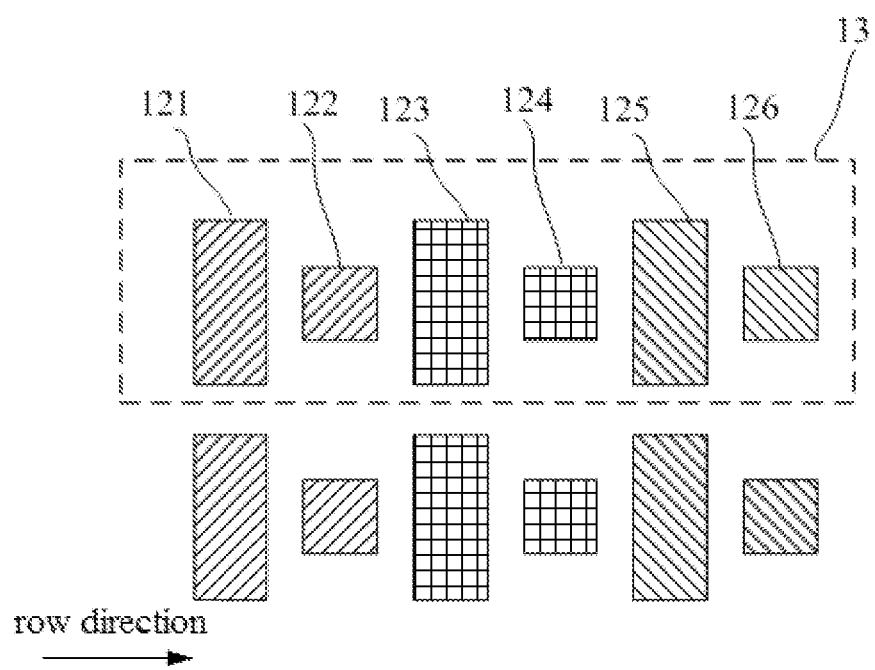
FIG. 9 illustrates a first arrangement manner of the pixel units provided in an embodiment of the present disclosure.

In this embodiment, the pixel units on the array substrate can be arranged in various manners, and the first and second organic light emitting diodes 144 and 145 having the first emitting light color, the first and second organic light emitting diodes 144 and 145 having the second emitting light color, and the first and second organic light emitting diodes 144 and 145 having the third emitting light color are alternately arranged in a row direction or in a column direction of the array. The arrangements of the pixel units are exemplarily described as follows:

A first manner: as shown in FIG. 9, which is a first arrangement manner of the pixel units provided in an embodiment of the present disclosure, in the row direction, adjacent six organic light-emitting diodes constitute a repeating unit 13.

In the repeating unit 13, the first organic light-emitting diode 121 having the first emitting light color, the second organic light emitting diode 122 having the first emitting light color, the first organic light-emitting diode 123 having the second emitting light color, the second organic light-emitting diode 124 having the second emitting light color, the first organic light-emitting diode 125 having the third emitting light color and the second organic light-emitting diode 126 having the third emitting light color are sequentially arranged. In a same row, the first and second organic light-emitting diodes having same color are adjacent with one another, so that the luminance of the organic bottom light-emitting diodes (the first organic light-emitting diodes) and the luminance of the organic top light-emitting diodes (the second organic light-emitting diodes) are uniform, and thus the luminance of the whole display is uniform.

Figure 10:
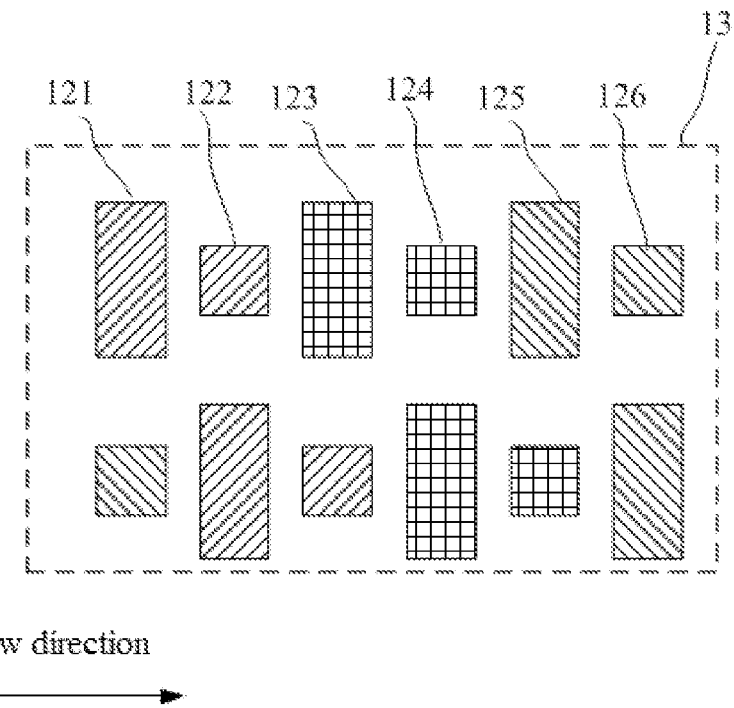
FIG. 10 illustrates a second arrangement manner of the pixel units provided in an embodiment of the present disclosure.

A second manner: as shown in FIG. 10, which is a second arrangement manner of the pixel units provided in an embodiment of the present disclosure, twelve organic light emitting diodes located in two adjacent rows and six adjacent columns constitute a repeating unit 13.

In the first row of the repeating unit 13, the first organic light-emitting diode 121 having the first emitting light color, the second organic light emitting diode 122 having the first emitting light color, the first organic light-emitting diode 123 having the second emitting light color, the second organic light-emitting diode 124 having the second emitting light color, the first organic light-emitting diode 125 having the third emitting light color and the second organic light-emitting diode 126 having the third emitting light color are sequentially arranged.

In the second row of the repeating unit 13, the second organic light-emitting diode 126 having the third emitting light color, the first organic light-emitting diode 121 having the first emitting light color, the second organic light emitting diode 122 having the first emitting light color, the first organic light-emitting diode 123 having the second emitting light color, the second organic light-emitting diode 124 having the second emitting light color, and the first organic light-emitting diode 125 having the third emitting light color are sequentially arranged. In a same column, the organic top light-emitting diodes (the second organic light-emitting diodes) and the organic bottom light-emitting diodes (the first organic light-emitting diodes) are arranged in staggered manner. Since the area of the unit pixels where the organic bottom light-emitting diodes are located is larger than the area of the unit pixels where the organic top light-emitting diodes are located, the organic light-emitting display panel can be arranged more compactly as a whole, and thus more organic light-emitting diodes can be arranged in the organic light-emitting display panel with the same area.

Figure 11:
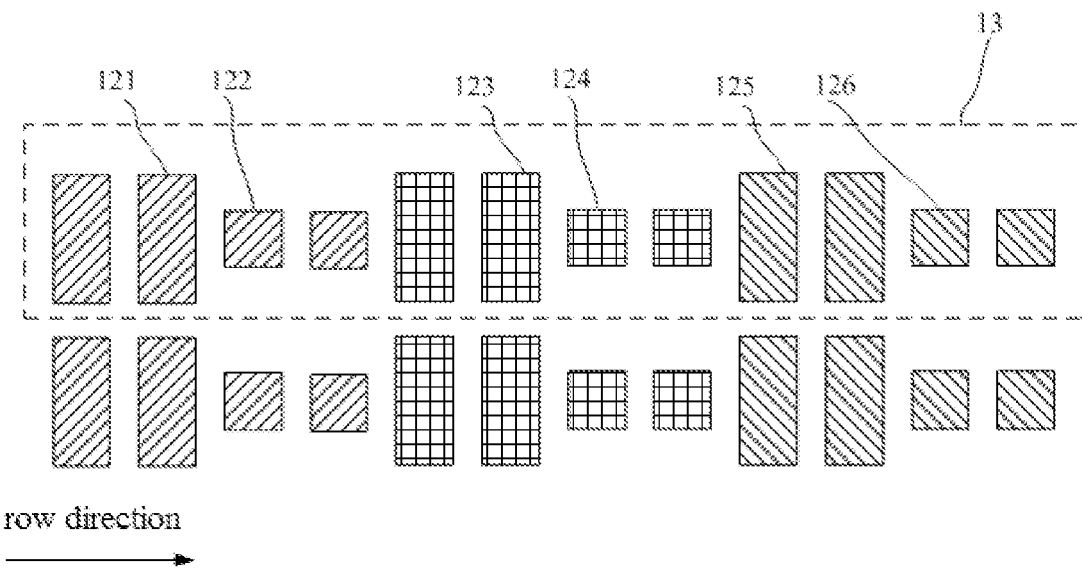
FIG. 11 illustrates a third arrangement manner of the pixel units provided in an embodiment of the present disclosure.

A third manner: as shown in FIG. 11, which is a third arrangement manner of the pixel units provided in an embodiment of the present disclosure, in the row direction, each twelve organic light-emitting diodes constitute a repeating unit 13.

In the repeating unit 13, two first organic light-emitting diodes 121 having the first emitting light color, two second organic light emitting diodes 122 having the first emitting light color, two first organic light-emitting diodes 123 having the second emitting light color, two second organic light-emitting diodes 124 having the second emitting light color, two first organic light-emitting diodes 125 having the third emitting light color and two second organic light-emitting diodes 126 having the third emitting light color are sequentially arranged.

Figure 12:
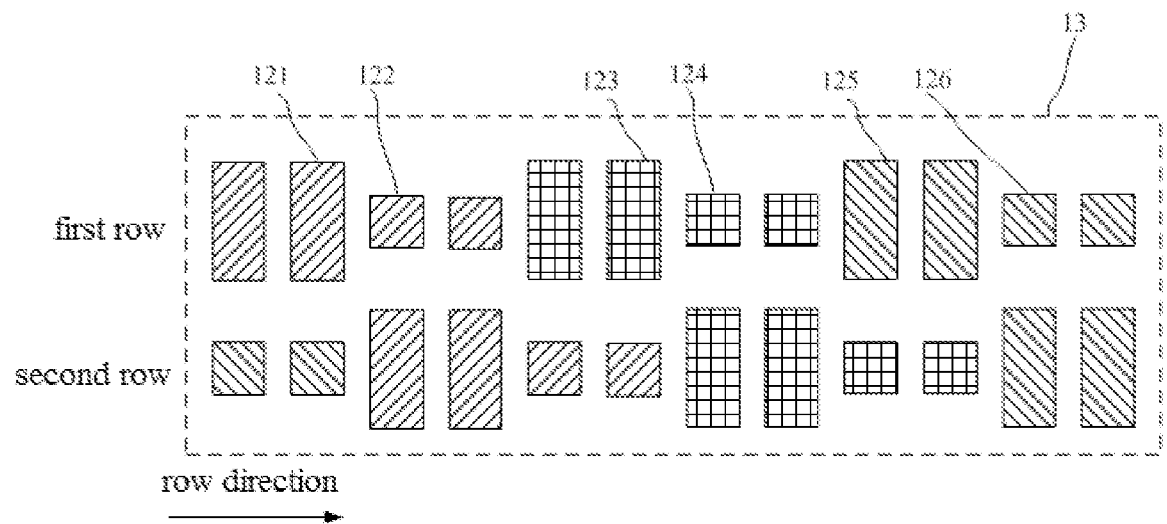
FIG. 12 illustrates a fourth arrangement manner of the pixel units provided in an embodiment of the present disclosure.

A fourth manner: as shown in FIG. 12, which is a fourth arrangement manner of the pixel units provided in an embodiment of the present disclosure, twenty-four organic light emitting diodes located in two adjacent rows and twelve adjacent columns constitute a repeating unit 13.

In the first row of the repeating unit 13, two first light-emitting diodes 121 having the first emitting light color, two second organic light emitting diodes 122 having the first emitting light color, two first organic light-emitting diodes 123 having the second emitting light color, two second organic light-emitting diodes 124 having the second emitting light color, two first organic light-emitting diodes 125 having the third emitting light color and two second organic light-emitting diodes 126 having the third emitting light color are sequentially arranged.

In the second row of the repeating unit 13, two second organic light-emitting diodes 126 having the third emitting light color, two first organic light-emitting diodes 121 having the first emitting light color, two second organic light emitting diodes 122 having the first emitting light color, two first organic light-emitting diodes 123 having the second emitting light color, two second organic light-emitting diodes 124 having the second emitting light color, and two first organic light-emitting diodes 125 having the third emitting light color are sequentially arranged.

Figure 13:
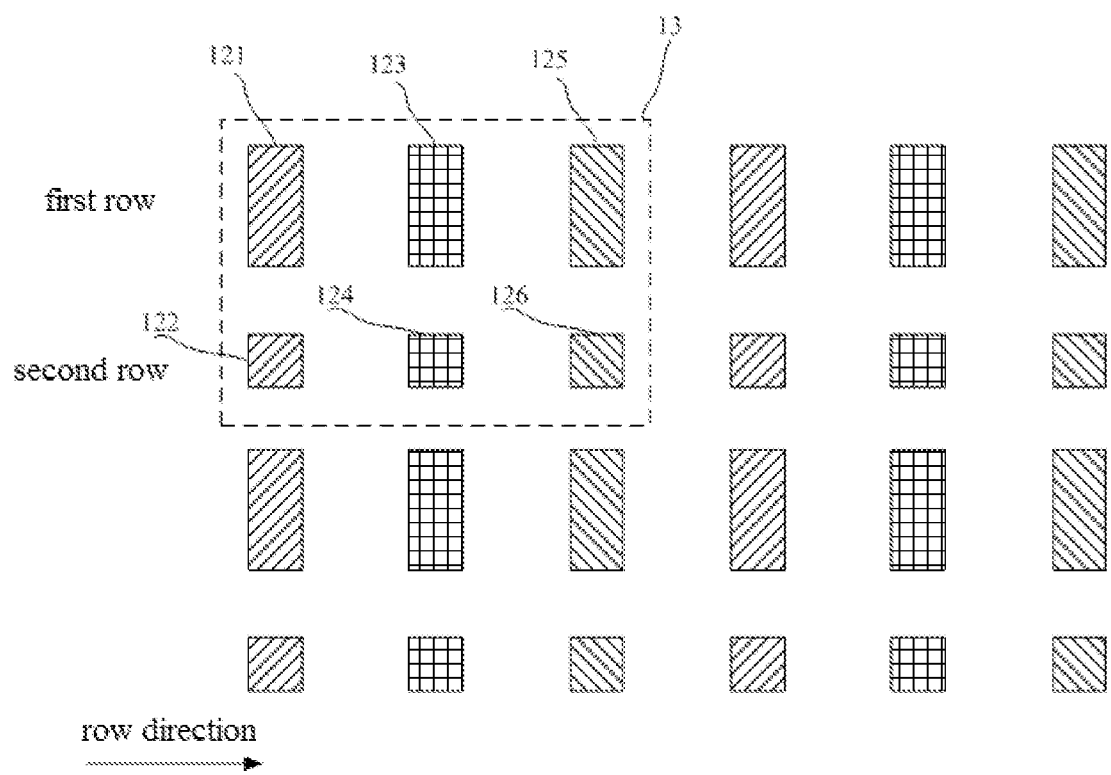
FIG. 13 illustrates a fifth arrangement manner of the pixel units provided in an embodiment of the present disclosure.

A fifth manner: as shown in FIG. 13, which is a fifth arrangement manner of the pixel units provided in an embodiment of the present disclosure, six organic light emitting diodes located in two adjacent rows and three adjacent columns constitute a repeating unit 13.

In the first row of the repeating unit 13, the first organic light-emitting diode 121 having the first emitting light color, the first organic light-emitting diode 123 having the second emitting light color and the first organic light-emitting diode 125 having the third emitting light color are sequentially arranged.

In the second row of the repeating unit 13, the second organic light emitting diode 122 having the first emitting light color, the second organic light-emitting diode 124 having the second emitting light color and the second organic light-emitting diode 126 having the third emitting light color are sequentially arranged.

Figure 14:
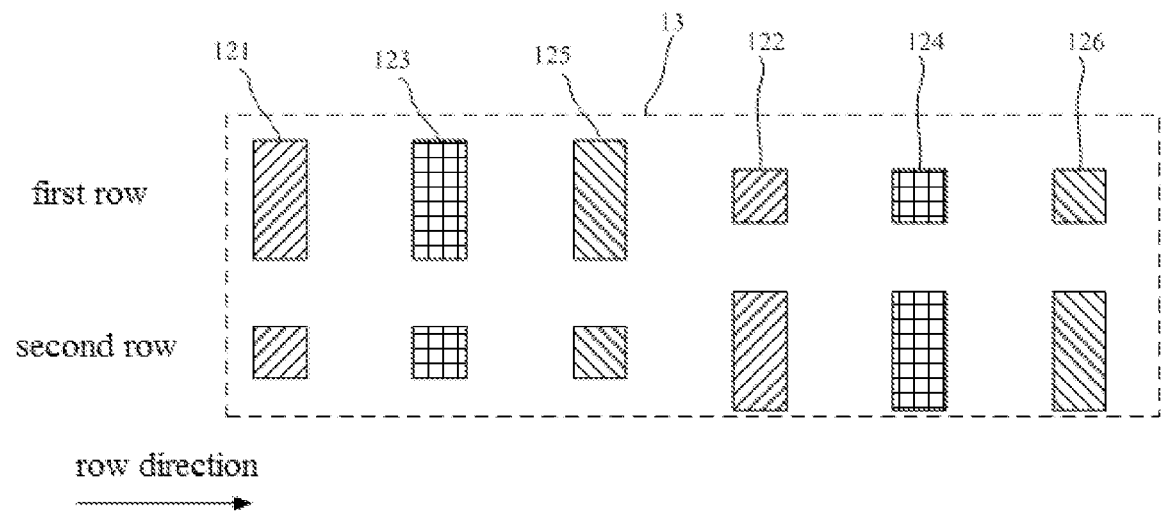
FIG. 14 illustrates a sixth arrangement manner of the pixel units provided in an embodiment of the present disclosure.

A sixth manner: as shown in FIG. 14, which is a sixth arrangement manner of the pixel units provided in an embodiment of the present disclosure, twelve organic light emitting diodes located in two adjacent rows and six adjacent columns constitute a repeating unit 13.

In the first row of the repeating unit 13, the first organic light-emitting diode 121 having the first emitting light color, the first organic light-emitting diode 123 having the second emitting light color, the first organic light-emitting diode 125 having the third emitting light color, the second organic light emitting diode 122 having the first emitting light color, the second organic light-emitting diode 124 having the second emitting light color, and the second organic light-emitting diode 126 having the third emitting light color are sequentially arranged.

In the second row of the repeating unit 13, the second organic light emitting diode 122 having the first emitting light color, the second organic light-emitting diode 124 having the second emitting light color, the second organic light-emitting diode 126 having the third emitting light color, the first organic light-emitting diode 121 having the first emitting light color, the first organic light-emitting diode 123 having the second emitting light color, and the first organic light-emitting diode 125 having the third emitting light color are sequentially arranged.

It should be understood that, the six types of the arrangement manners of the pixel units described above are exemplary, but not intended to limit the arrangement of the pixel units.

Figure 15:
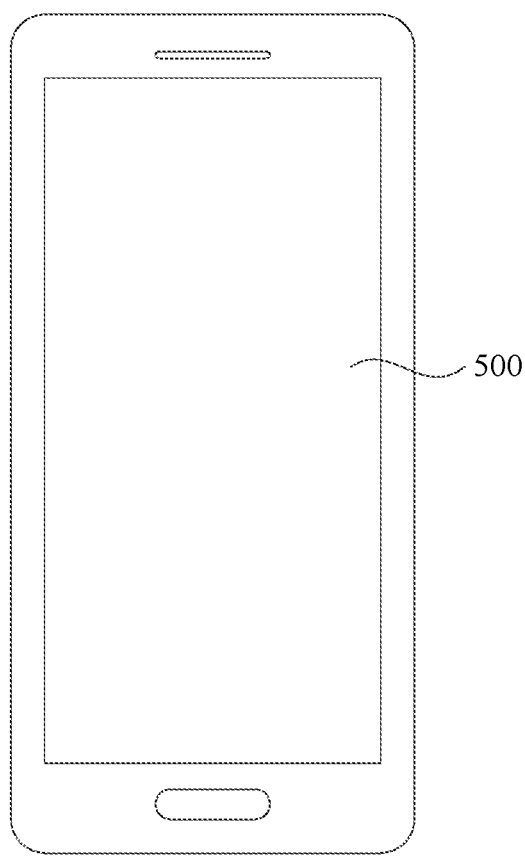
FIG. 15 illustrates a structural schematic diagram of an organic light-emitting display device provided in an embodiment of the present disclosure.

FIG. 15 illustrates a structural schematic diagram of an organic light-emitting display device provided in an embodiment of the present disclosure. The organic light-emitting display device 500 includes the organic light-emitting display panel according to the embodiments of the present disclosure. It should be understood that the organic light-emitting display device is not limited to a cellphone which is shown in FIG. 15 as an example, and more specifically, the organic light-emitting display device can include but are not limited to Personal Computer (PC), Personal Digital Assistant (PDA), wireless handheld device, Tablet Computer, MP4 displayer, television or any other electronic devices with display function.

It should be understood that the embodiments mentioned above are merely intended to describe the technical solutions of the present disclosure, but not to limit the present disclosure. Although the present disclosure is described in detail with reference to these embodiments, it should be understood that those skilled in the art can modify the technical solutions described in the embodiments, or parts of or all technical features can be equivalently replaced, without departing from the substantial protection scope of the present disclosure.

What is claimed is:

1. An organic light-emitting display panel, comprising:
an array substrate, the array substrate comprising a plurality of pixel units; and
a plurality of organic light-emitting diodes located in the plurality of pixel units of the array substrate, the plurality of organic light-emitting diodes comprising a plurality of first organic light-emitting diodes and a plurality of second organic light-emitting diodes, and the plurality of first organic light-emitting diodes and the plurality of second organic light-emitting diodes correspond to the plurality of pixel units in one-to-one correspondence,
wherein the first organic light-emitting diodes are organic bottom light-emitting diodes and the second organic light-emitting diodes are organic top light-emitting diodes; and
wherein an area of the pixel unit where the first organic light-emitting diode is located is larger than an area of the pixel unit where the second organic light-emitting diode is located; and
wherein a luminous intensity per unit area of the pixel unit where the second organic light-emitting diode is located is greater than a luminous intensity per unit area of the pixel unit where the first organic light-emitting diode is located.

2. The organic light-emitting display panel according to claim 1, wherein the area of the pixel unit where the first organic light-emitting diode is located is 1.2-2.5 times of the area of the pixel unit where the second organic light-emitting diode is located.

3. The organic light-emitting display panel according to claim 1, wherein the plurality of pixel units of the array substrate are arranged in an array; the first organic light-emitting diodes comprise a first organic light-emitting diode having a first emitting light color, a first organic light-emitting diode having a second emitting light color, and a first organic light-emitting diode having a third emitting light color; the second organic light-emitting diodes comprise a second organic light-emitting diode having the first emitting light color, a second organic light-emitting diode having the second emitting light color, and a second organic light-emitting diode having the third emitting light color;
the first emitting light color, the second emitting light color and the third emitting light color are different from one another and selected from a group consisting of red, green and blue.

4. The organic light-emitting display panel according to claim 3, wherein the first and second organic light emitting diodes having the first emitting light color, the first and second organic light emitting diodes having the second emitting light color, and the first and second organic light emitting diodes having the third emitting light color are alternately arranged in a row direction or a column direction of the array.

5. The organic light-emitting display panel according to claim 4, wherein adjacent six of the organic light-emitting diodes in the row direction constitute a repeating unit; and
in the repeating unit, the first organic light-emitting diode having the first emitting light color, the second organic light emitting diode having the first emitting light color, the first organic light-emitting diode having the second emitting light color, the second organic light-emitting diode having the second emitting light color, the first organic light-emitting diode having the third emitting light color, and the second organic light-emitting diode having the third emitting light color are sequentially arranged in the row direction.

6. The organic light-emitting display panel according to claim 4, wherein two adjacent rows and six adjacent columns of the array contains twelve of the organic light emitting diodes, and the twelve organic light emitting diodes constitute a repeating unit;
in a first row of the repeating unit, the first organic light-emitting diode having the first emitting light color, the second organic light emitting diode having the first emitting light color, the first organic light-emitting diode having the second emitting light color, the second organic light-emitting diode having the second emitting light color, the first organic light-emitting diode having the third emitting light color, and the second organic light-emitting diode having the third emitting light color are sequentially arranged in the row direction; and
in a second row of the repeating unit, the second organic light-emitting diode having the third emitting light color, the first organic light-emitting diode having the first emitting light color, the second organic light emitting diode having the first emitting light color, the first organic light-emitting diode having the second emitting light color, the second organic light-emitting diode having the second emitting light color, and the first organic light-emitting diode having the third emitting light color are sequentially arranged in the row direction.

7. The organic light-emitting display panel according to claim 4, wherein adjacent twelve of the organic light-emitting diodes in the row direction constitute a repeating unit; and
in the repeating unit, two first organic light-emitting diodes having the first emitting light color, two second organic light emitting diodes having the first emitting light color, two first organic light-emitting diodes having the second emitting light color, two second organic light-emitting diodes having the second emitting light color, two first organic light-emitting diodes having the third emitting light color, and two second organic light-emitting diodes having the third emitting light color are sequentially arranged in the row direction.

8. The organic light-emitting display panel according to claim 4, wherein two adjacent rows and twelve adjacent columns of the array contain twenty-four of the organic light emitting diodes, the twenty-four organic light emitting diodes constitute a repeating unit;
  in a first row of the repeating unit, two first organic light-emitting diodes having the first emitting light color, two second organic light emitting diodes having the first emitting light color, two first organic light-emitting diodes having the second emitting light color, two second organic light-emitting diodes having the second emitting light color, two first organic light-emitting diodes having the third emitting light color, and two second organic light-emitting diodes having the third emitting light color are sequentially arranged in the row direction; and
  in a second row of the repeating unit, two second organic light-emitting diodes having the third emitting light color, two first organic light-emitting diodes having the first emitting light color, two second organic light emitting diodes having the first emitting light color, two first organic light-emitting diodes having the second emitting light color, two second organic light-emitting diodes having the second emitting light color, and two first organic light-emitting diodes having the third emitting light color are sequentially arranged in the row direction.

9. The organic light-emitting display panel according to claim 4, wherein two adjacent rows and three adjacent columns of the array contains six of the organic light emitting diodes, and the six organic light emitting diodes constitute a repeating unit;
  in a first row of the repeating unit, the first organic light-emitting diode having the first emitting light color, the first organic light-emitting diode having the second emitting light color, and the first organic light-emitting diode having the third emitting light color are sequentially arranged in the row direction; and
  in a second row of the repeating unit, the second organic light emitting diode having the first emitting light color, the second organic light-emitting diode having the second emitting light color, and the second organic light-emitting diode having the third emitting light color are sequentially arranged in the row direction.

10. The organic light-emitting display panel according to claim 4, wherein two adjacent rows and six adjacent columns of the array contain twelve of the organic light emitting diodes, and the twelve organic light emitting diodes constitute a repeating unit;
  in a first row of the repeating unit, the first organic light-emitting diode having the first emitting light color, the first organic light-emitting diode having the second emitting light color, the first organic light-emitting diode having the third emitting light color, the second organic light emitting diode having the first emitting light color, the second organic light-emitting diode having the second emitting light color, and the second organic light-emitting diode having the third emitting light color are sequentially arranged in the row direction; and
  in a second row of the repeating unit, the second organic light emitting diode having the first emitting light color, the second organic light-emitting diode having the second emitting light color, the second organic light-emitting diode having the third emitting light color, the first organic light-emitting diode having the first emitting light color, the first organic light-emitting diode having the second emitting light color, and the first organic light-emitting diode having the third emitting light color are sequentially arranged in the row direction.

11. The organic light-emitting display panel according to claim 1, wherein each of the organic bottom light-emitting diodes and the organic top light-emitting diodes comprises an anode, a cathode arranged opposite to the anode, and an organic functional layer between the anode and the cathode; wherein
  the organic functional layer comprises a microcavity adjusting layer, an electron transmission layer, and a light-emitting layer between the microcavity adjusting layer and the electron transmission layer; wherein
  the microcavity adjusting layer is in contact with the anode, and the electron transmission layer is in contact with the cathode.

12. The organic light-emitting display panel according to claim 11, wherein the cathode of the organic bottom light-emitting diode is a total reflection cathode, and the anode of the organic bottom light-emitting diode is a transparent anode; and
  an anode of the organic top light-emitting diode is a total reflection anode, and the cathode of the organic top light-emitting diode is a translucent cathode.

13. The organic light-emitting display panel according to claim 11, wherein the cathode of the organic bottom light-emitting diode is made of silver and has a thickness greater than 500 Å, and the anode the organic bottom light-emitting diode is made of indium tin oxide (ITO)and has a thickness greater than 80 Å;
  the cathode of the organic top light-emitting diode is made of silver or magnesium-silver alloy and has a thickness less than 200 Å, and the anode of the organic top light-emitting diode is made of two ITO layers and an Ag layer between the two ITO layers, wherein the Ag layer has a thickness greater than 500 Å and the ITO layer closer to the organic functional layer has a thickness less than 1000 Å.

14. The organic light-emitting display panel according to claim 11, wherein a thickness of the microcavity adjusting layer is greater than ½ a total thickness of the organic functional layer.

15. The organic light-emitting display panel according to claim 14, wherein the microcavity adjusting layer comprises a hole injection layer, a first hole transmission layer and a second hole transmission layer.

16. The organic light-emitting display panel according to claim 11, wherein a cap layer is provided on a side of the cathode of the organic top light-emitting diode away from the organic functional layer.

17. An organic light-emitting display device, comprising an organic light-emitting display panel, wherein the organic light-emitting display panel comprises:
  an array substrate, the array substrate comprising a plurality of pixel units; and
  a plurality of organic light-emitting diodes located in the plurality of pixel units of the array substrate, the plurality of organic light-emitting diodes comprising a plurality of first organic light-emitting diodes and a plurality of second organic light-emitting diodes, and the plurality of first organic light-emitting diodes and the plurality of second organic light-emitting diodes correspond to the plurality of pixel units in one-to-one correspondence, wherein the first organic light-emitting diodes are organic bottom light-emitting diodes and the second organic light-emitting diodes are organic top light-emitting diodes; and wherein an area of the pixel unit where the first organic light-emitting diode is located is larger than an area of the pixel unit where the second organic light-emitting diode is located; and wherein a luminous intensity per unit area of the pixel unit where the second organic light-emitting diode is located is greater than a luminous intensity per unit area of the pixel unit where the first organic light-emitting diode is located.

\* \* \* \* \*